(12) United States Patent
Shen et al.

(10) Patent No.: US 9,905,547 B2
(45) Date of Patent: Feb. 27, 2018

(54) CHIP WITH LIGHT ENERGY HARVESTER

(71) Applicant: National Applied Research Laboratories, Taipei (TW)

(72) Inventors: Chang-Hong Shen, Hsinchu (TW); Jia-Min Shieh, Hsinchu (TW); Wen-Hsien Huang, Hsinchu (TW); Tsung-Ta Wu, Hsinchu (TW); Chih-Chao Yang, Hsinchu (TW); Tung-Ying Hsieh, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 0 days.

(21) Appl. No.: 14/883,227

(22) Filed: Oct. 14, 2015

(65) Prior Publication Data

US 2017/0110444 A1   Apr. 20, 2017

(51) Int. Cl.
*H01L 31/062* (2012.01)
*H01L 25/16* (2006.01)
*H01L 23/58* (2006.01)
*H01L 31/028* (2006.01)
*H01L 31/075* (2012.01)

(52) U.S. Cl.
CPC ............ *H01L 25/167* (2013.01); *H01L 23/58* (2013.01); *H01L 31/028* (2013.01); *H01L 31/075* (2013.01); *Y02E 10/547* (2013.01); *Y02E 10/548* (2013.01)

(58) Field of Classification Search
CPC . H01L 25/167; H01L 31/0547; H01L 31/074; H01L 31/0725
See application file for complete search history.

(56) References Cited

U.S. PATENT DOCUMENTS

| 6,297,442 | B1 | 10/2001 | Yagi et al. |
| 8,063,424 | B2 | 11/2011 | Gebara et al. |
| 8,298,875 | B1 | 10/2012 | Or-Bach et al. |
| 8,730,179 | B2 | 5/2014 | Rosenblatt et al. |
| 8,803,206 | B1* | 8/2014 | Or-Bach ............... H01L 27/098 257/278 |
| 8,822,897 | B2 | 9/2014 | Tian et al. |
| 2012/0187897 | A1* | 7/2012 | Lenk ..................... H01M 10/44 320/101 |
| 2013/0167917 | A1* | 7/2013 | Myong ................. H01L 31/075 136/255 |

(Continued)

FOREIGN PATENT DOCUMENTS

| TW | 200810319 A | 2/2008 |
| TW | 201140863 A | 11/2011 |
| WO | 2015/074385 A1 | 5/2015 |

OTHER PUBLICATIONS

Shi et al., Characterization of Low-Temperature Processed Single-Crystalline Silicon Thin-Film Transistor on Glass, IEEE Electron Device Letters, vol. 24, No. 9, 2003.*

(Continued)

*Primary Examiner* — Syed Gheyas
(74) *Attorney, Agent, or Firm* — WPAT, PC

(57) ABSTRACT

A chipset with light energy harvester, includes a substrate, a functional element layer, and a light energy harvesting layer, both are stacked vertically on the substrate, and an interconnects connected between the functional element layer and the light energy harvesting layer.

14 Claims, 14 Drawing Sheets

(56) References Cited

U.S. PATENT DOCUMENTS

2014/0007927 A1* 1/2014 Gaul ............... H01L 31/02021
136/252

OTHER PUBLICATIONS

Heterogeneously integrated sub-40nm low-power epi-like Ge/Si monolithic 3D-IC with stacked SiGeC ambient light harvester'—Electron Devices Meeting (IEDM), 2014 IEEE International, pp. 3.6.1-3.6.4.*

Shieh et al.—Monolithic 3D electronics by sub-400o C Sequential Layered Integration, Paper MP-CK-8 presented in IEEE Nanotechnology Materials and Devices Conference (IEEE NMDC 2013), Oct. 7-9, 2013, National Cheng Kung University, Tainan, Taiwan.*

Shen et al. "Heterogeneously integrated sub-40nm low-power epi-like Ge/Si monolithic 3D-IC with stacked SiGeC ambient light harvester", Dec. 15, 2014, Electron Devices Meeting (IEDM), 2014 IEEE International.

Shen et al. "03.6 CDI: Heterogeneously Integrated sub-40nm Low-power Epi-like Ge/Si Monolithic 3D-IC with Stacked SiGeC Ambient Light Harvester", Dec. 15, 2014, 03: CDI: Advanced CMOS Technology Platform (Grand Ballroom A).

Sebastian Anthony "IBM creates first cheap, commercially viable, electronic-photonic integrated chip", Dec. 10, 2012, Ziff Davis, LLC. PCMag Digital Group.

Zahler et al. "Wafer Bonding and Layer Transfer Processes for High Efficiency Solar Cells", 2003, NCPV and Solar Program Review Meeting 2003.

Mina Danesh, "An Autonomous Wireless Sensor Node Incorporating a Solar Cell Antenna for Energy Harvesting", Dec. 2011, IEEE Transactions on Microwave Theory and Techniques, vol. 59, No. 12.

Hu et al. "A Self-Powered System for Large-Scale Strain Sensing by Combining CMOS ICs With Large-Area Electronics Yingzhe", Apr. 2014, IEEE Journal of Solid-State Circuits, vol. 49, No. 4.

Lu et al. "Integration of Solar Cells on Top of CMOS Chips Part I: a-Si Solar Cells", Jul. 2011, IEEE Transactions on Electron Devices, vol. 58, No. 7.

Lu et al. "Integration of Solar Cells on Top of CMOS Chips—Part II: CIGS Solar Cells", Aug. 2011, IEEE Transactions on Electron Devices, vol. 58, No. 8.

Shin et al. "Cost-Effective Integration of an a-Si:H Solar Cell and a ZnO TFT Ring Oscillator—Toward an Autonomously Powered Circuit", Dec. 2013, IEEE Electron Device Letters, vol. 34, No. 12.

* cited by examiner

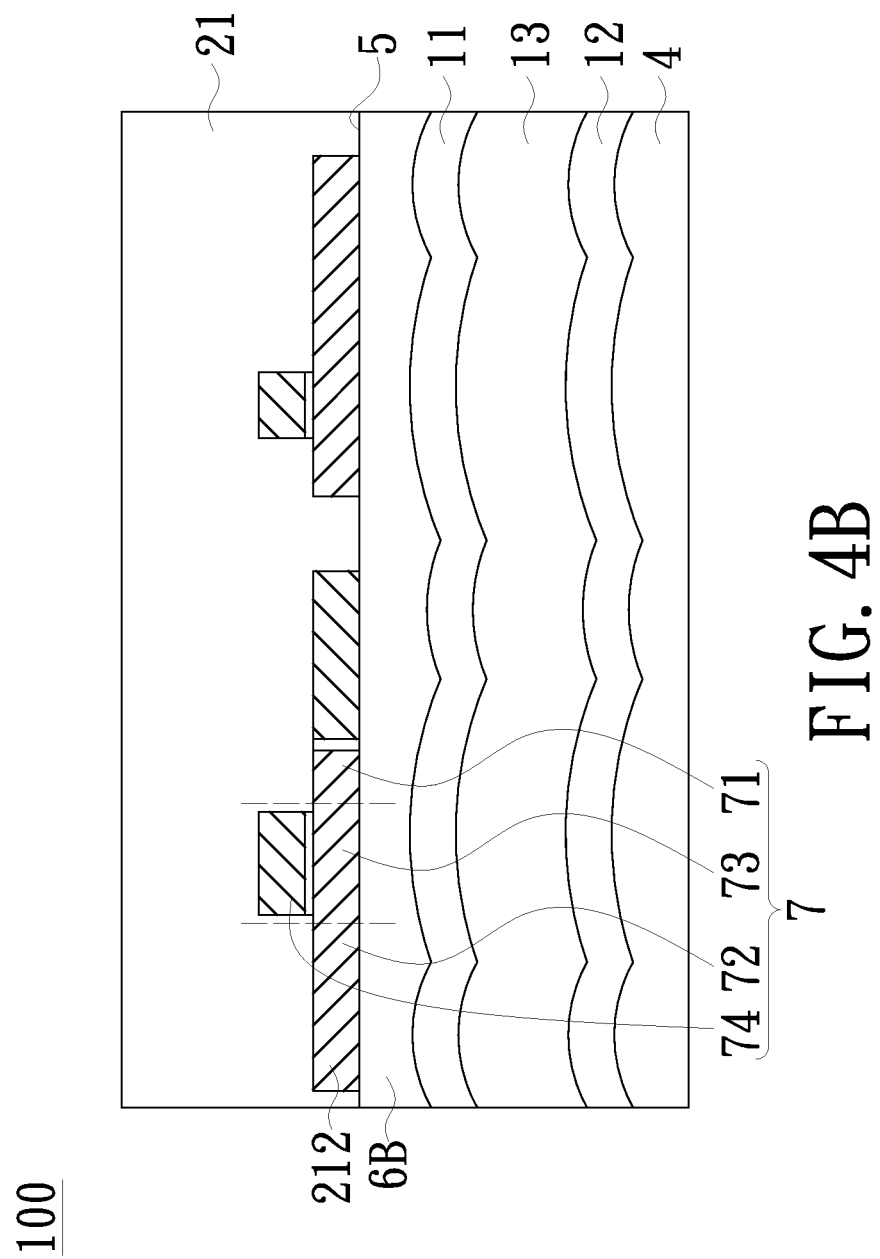

CHIP WITH LIGHT ENERGY HARVESTER

TECHNICAL FIELD

The present invention relates generally to a semiconductor chip, and more particularly to a chip with self-powered function or capable of capturing the signal of a light energy harvester.

BACKGROUND

The development of wearable electronics and wire-less network devices bring the dramatic growth of Internet of Thing (IoT) chips. Currently, the IoT chips are often equipped in the environment with power supply. On the contrary, the IoT chips equipped in the environments with no power supply, such as outdoor emergency protective systems, outdoor temperature regulation systems, indoor real-time medical systems and indoor logistic systems, will become the mainstream of IoT chips in the future. However, there are three inevitable issues emerging. The first one is long signal/energy transport and high power loss. The second one is the energy harvesting of indoor light, and the last one is the application in glass and flexible substrates.

FIG. 1 is a schematic view of a conventional two-dimensional self-powered chip. A self-powered device based on the circuit board 91 combines the light energy harvesting element A, such as solar cells, etc., and the other functional elements B, C, D . . . and so on, which are electrically connected to each other. Wherein, the light energy harvesting element A collects and converts light energy into electricity, and the electricity is transmitted through the power transmission point A1 signal to the energy signal receiving point C1, and thus is capable of supplying power for the operations of functional elements B, C, D . . . (may include such as an IoT chip) etc. Due to the two-dimensional configuration on circuit boards in the conventional methods, the energy transfer distance H will be up to at least a few millimeters or more, which is not only unfavorable to the downsizing of elements, but also bearing to the energy loss during transferring and other issues.

In addition, most traditional environmental energy harvesting devices are monocrystalline silicon/polycrystalline silicon-based solar cells, which can provide high photoelectric conversion efficiency (16-20%), but require the use of silicon substrates, with thicknesses of 220~250 μm, as the absorption layer. The three-dimensional heterogeneous vertical integration is inapplicable. Furthermore, the energy harvesting capacities of silicon solar cells for indoor lights are lower than those of the amorphous silicon solar cells.

SUMMARY

It is an object of the present invention to solve the problems of designing self-powered Io T chips as mentioned above.

It is another object of the present invention to develop a manufacturing process of light energy harvesting devices compatible with both the semiconductor manufacturing process and a three-dimensional stack, and to solve the difficulties encountered during the process integration.

In one embodiment of the present invention, a structure of a monolithic heterogeneous 3DIC chip with self-power function is provided. The structure can be manufactured by forming low-thermal budget devices on a dielectric layer. Deposit amorphous silicon, germanium, and silicon germanium films, which are thicker than other layers, by plasma. Then, induce micron (μm) level of polysilicon (Poly-Si), polysilicon germanium (Poly-SiGe) and polycrystalline germanium films (Poly-Ge) by green laser anneal (GLA). Moreover, thin the channel thickness through a nano/micron level chemical mechanical polishing, followed by etching to define polysilicon, polysilicon germanium and polycrystalline germanium channel region. The follow-up steps include constructing the transistor gate structure, for example, a high-k/metal gate (HK/MG), defining the source/drain region, and executing activation process, e.g., carbon dioxide laser annealing ($CO_2$-LA). Finally, the interconnects of the transistor are performed. The solar energy harvesting device may be equipped with single junction, double junction or multi junction amorphous silicon-germanium-carbon (a-SiGeC:H) thin film solar cells, in the design with the shortest signal/power transmission distance and minimum power loss. These solar cells may be embedded at any location in monolithic heterogeneous 3DIC chips, providing self-power to drive the functional chips. The advantages of short transport distance, low power loss, superior response of indoor light and low temperature processes will be widely used in self-power IoT chips and wearable electronics.

To make the above and other objects, features and advantages of the present invention can be more fully comprehensible, preferred embodiments below, and with the accompanying drawings, described in detail below.

BRIEF DESCRIPTION OF THE DRAWINGS

The present invention will become more readily apparent to those ordinarily skilled in the art after reviewing the following detailed description and accompanying drawings, in which:

FIGS. 4A to 4D are cross-sectional views schematically illustrating the device manufacturing process according to another embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
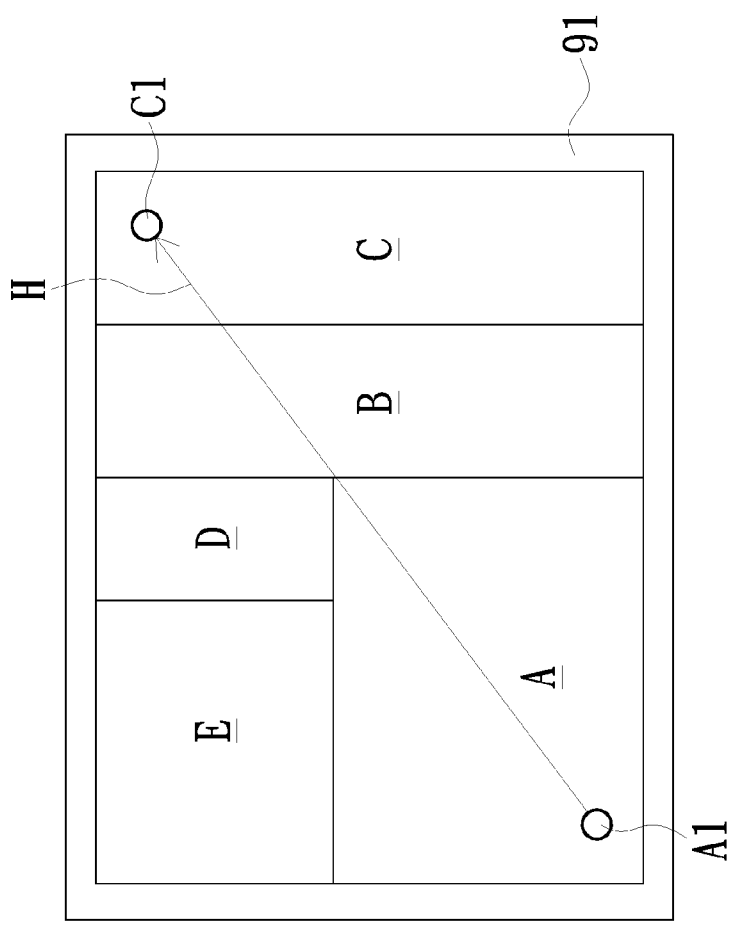
FIG. 1 is a schematic views of the structural arrangement of a conventional two-dimensional self-powered device.
Figure 2:
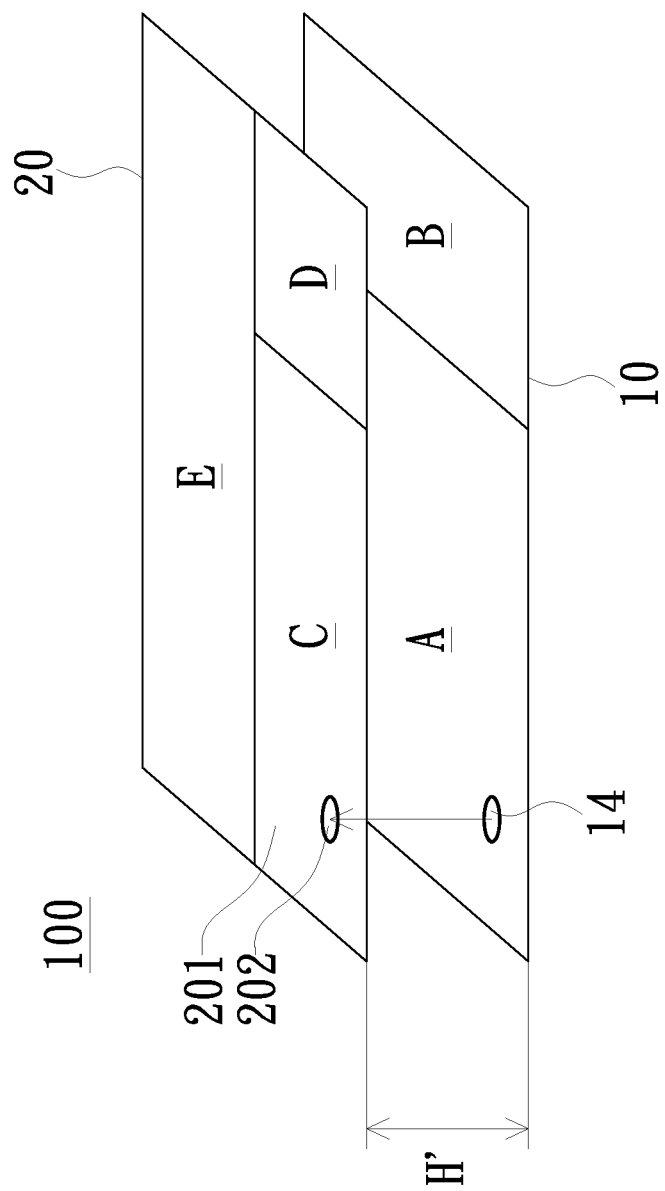
FIG. 2 is a schematic view of the structural arrangement according to an embodiment of the present invention.
Figure 4A:
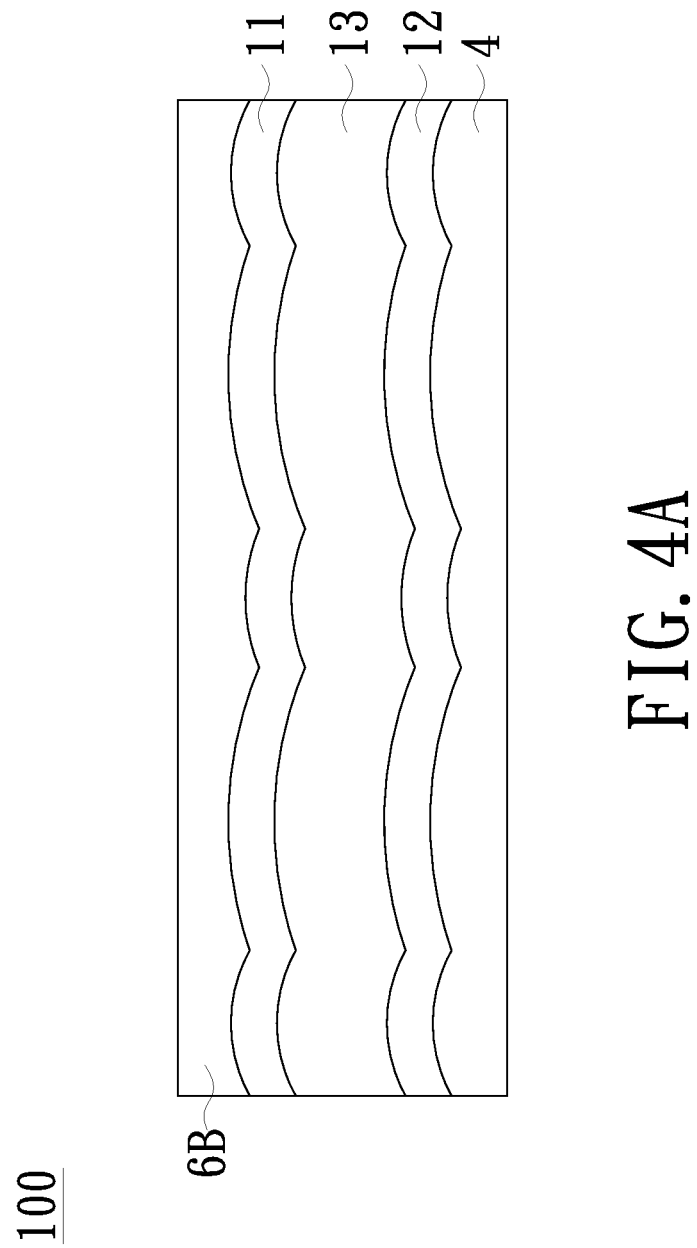
Figure 4C:
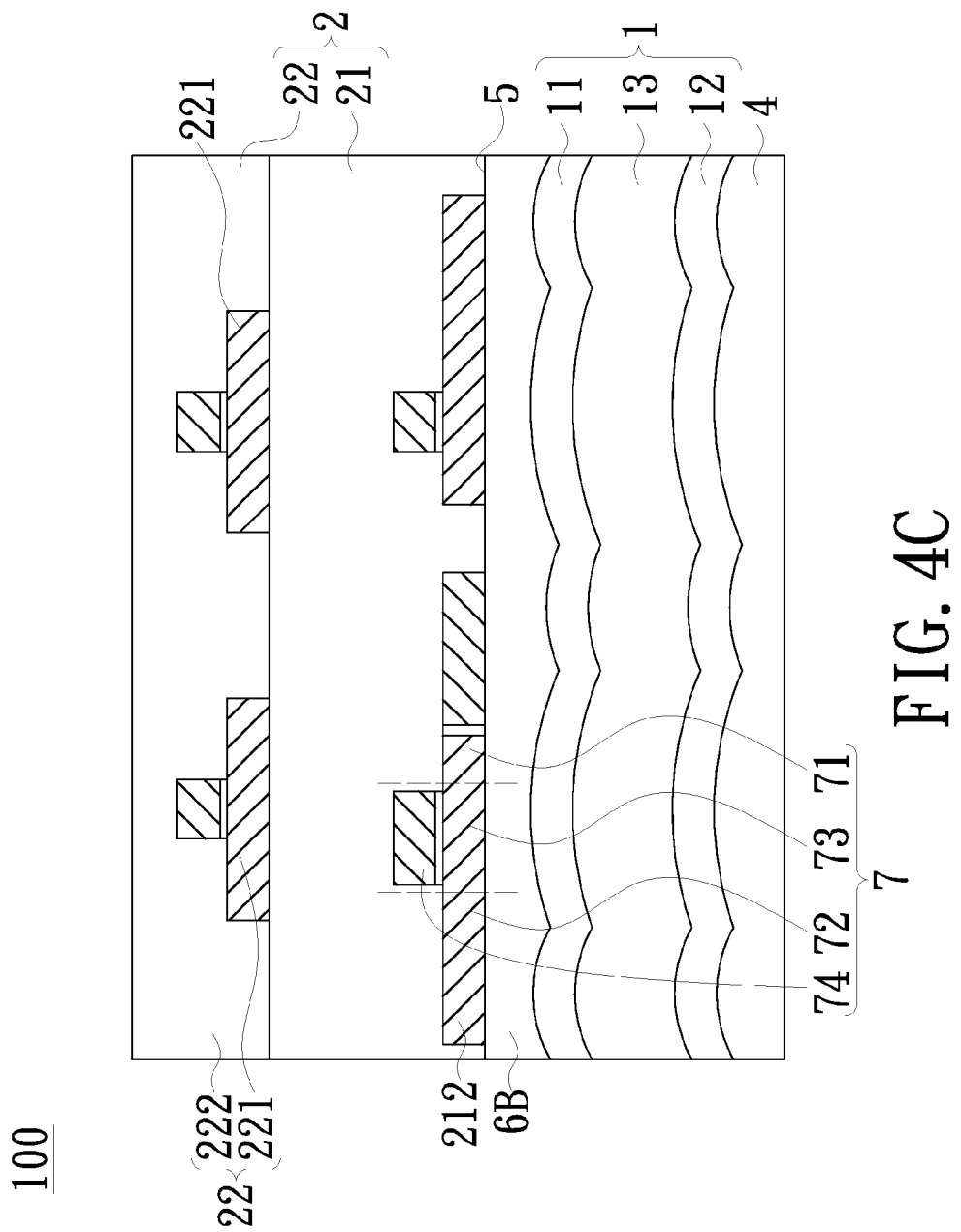
Figure 4D:
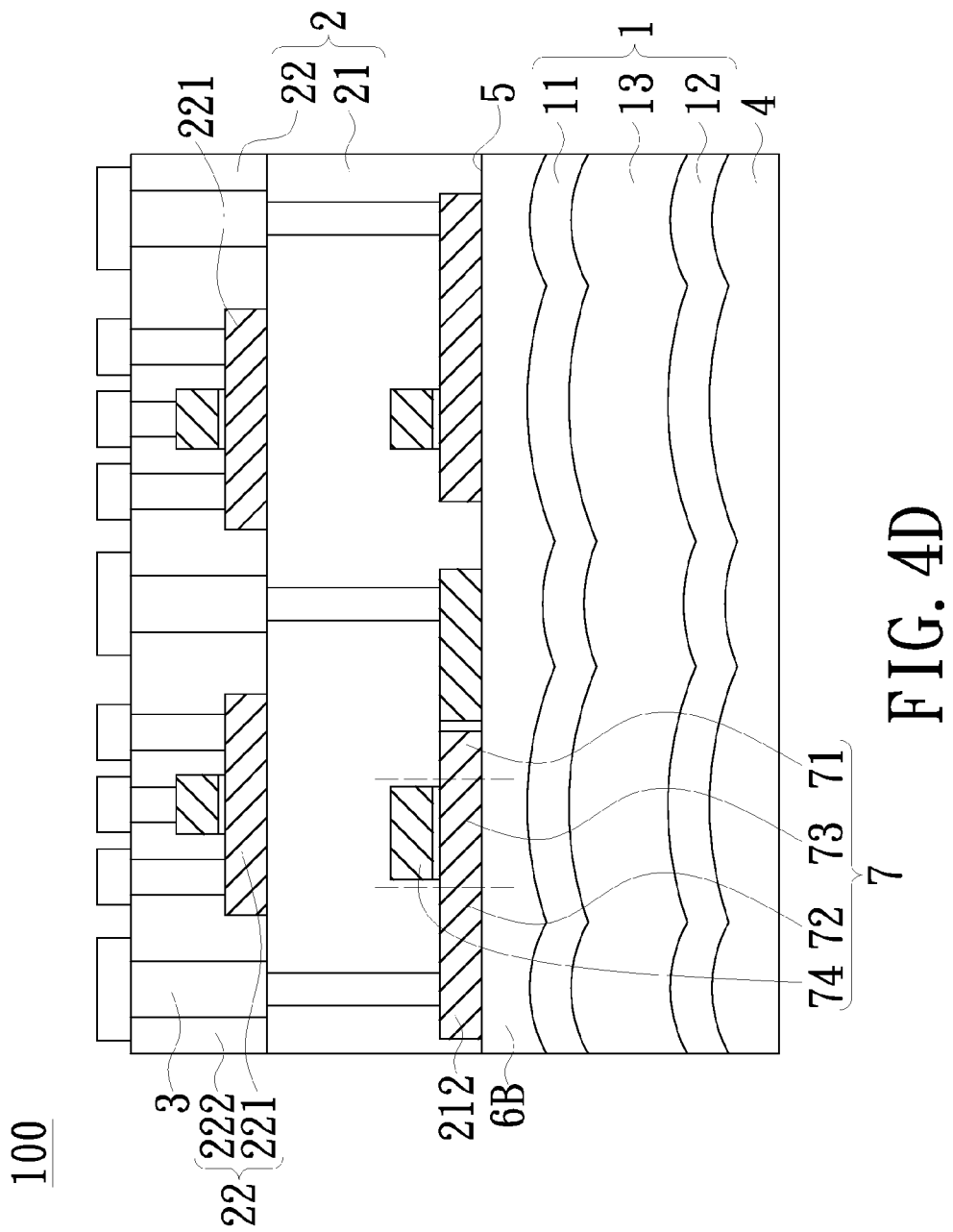
Figure 5A:
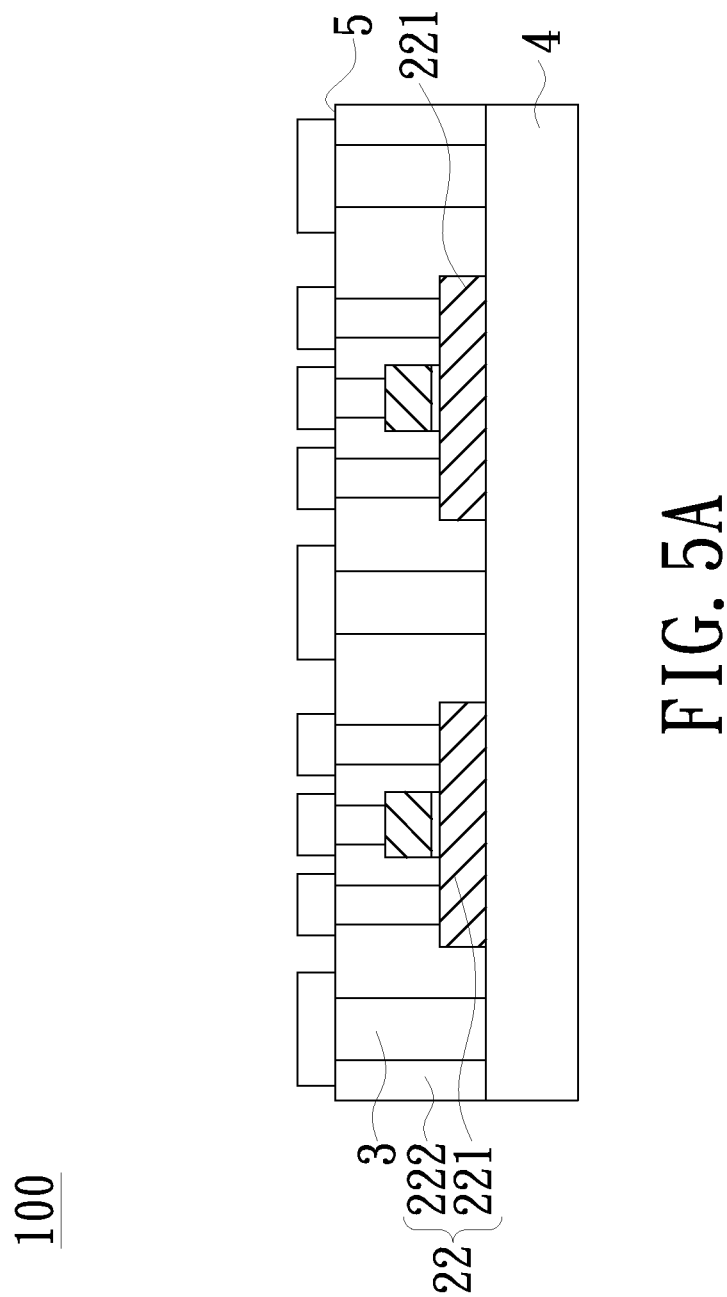
FIGS. 5A to 5D are cross-sectional views schematically illustrating the device manufacturing process according to still another embodiment of the present invention.
Figure 5B:
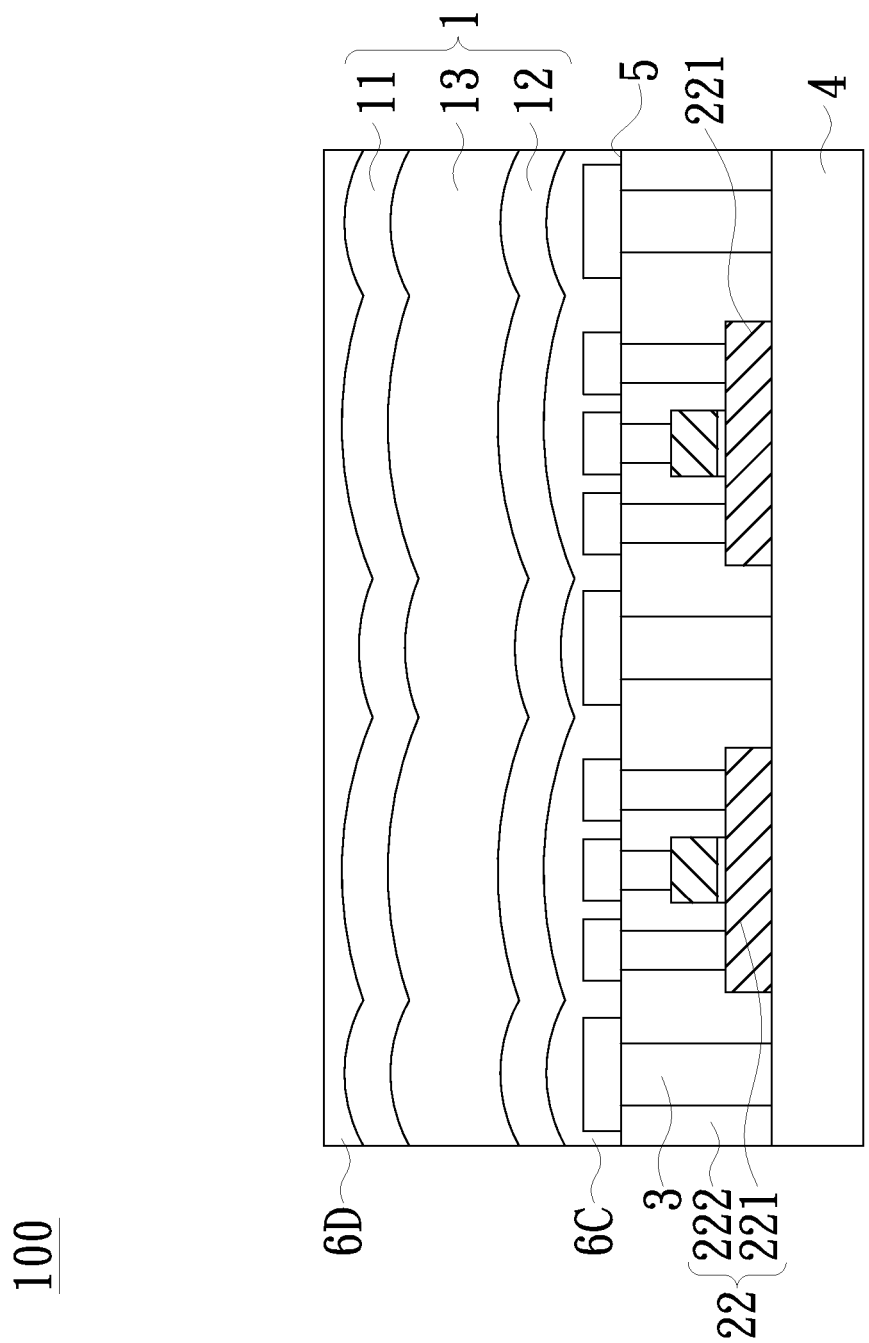
Figure 5C:
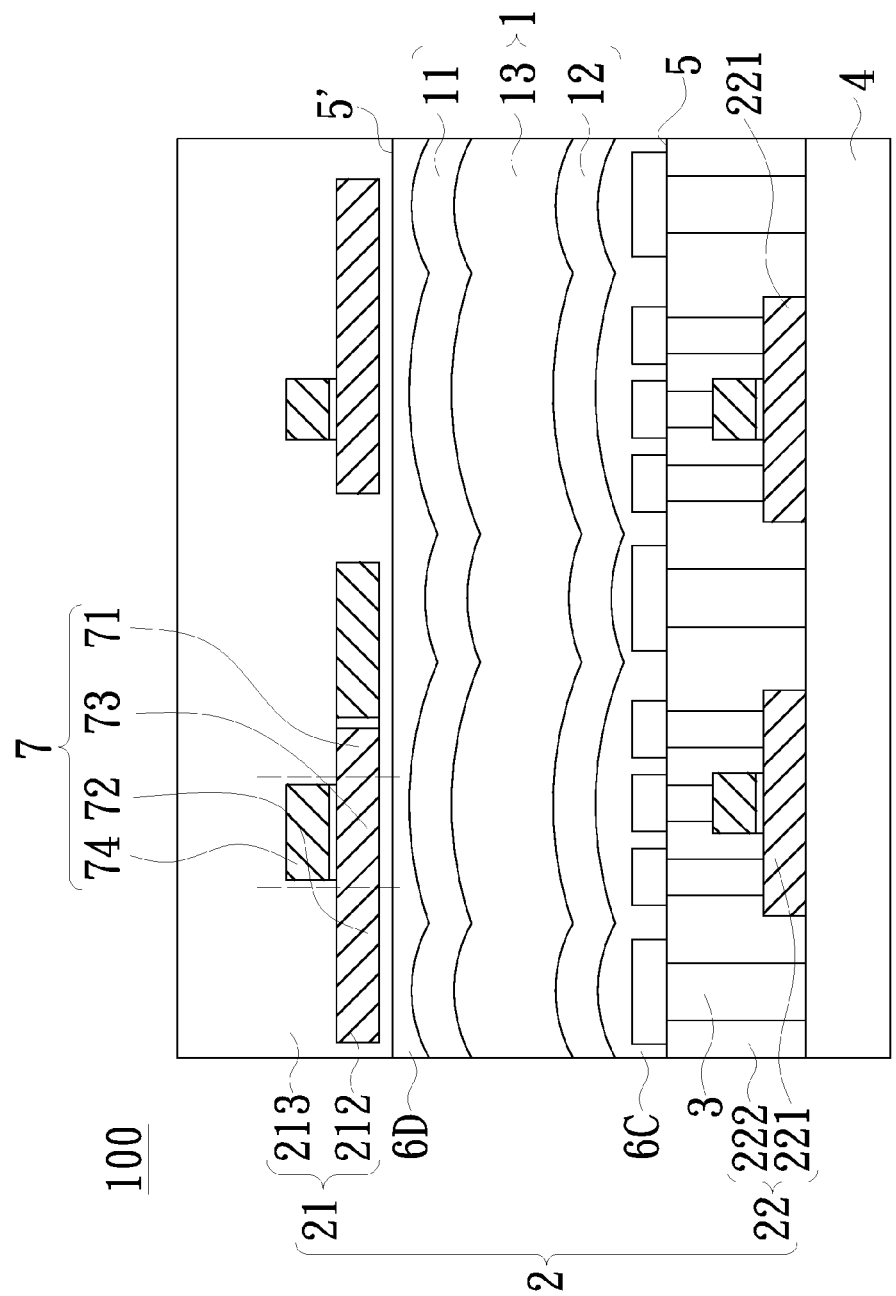
Figure 5D:
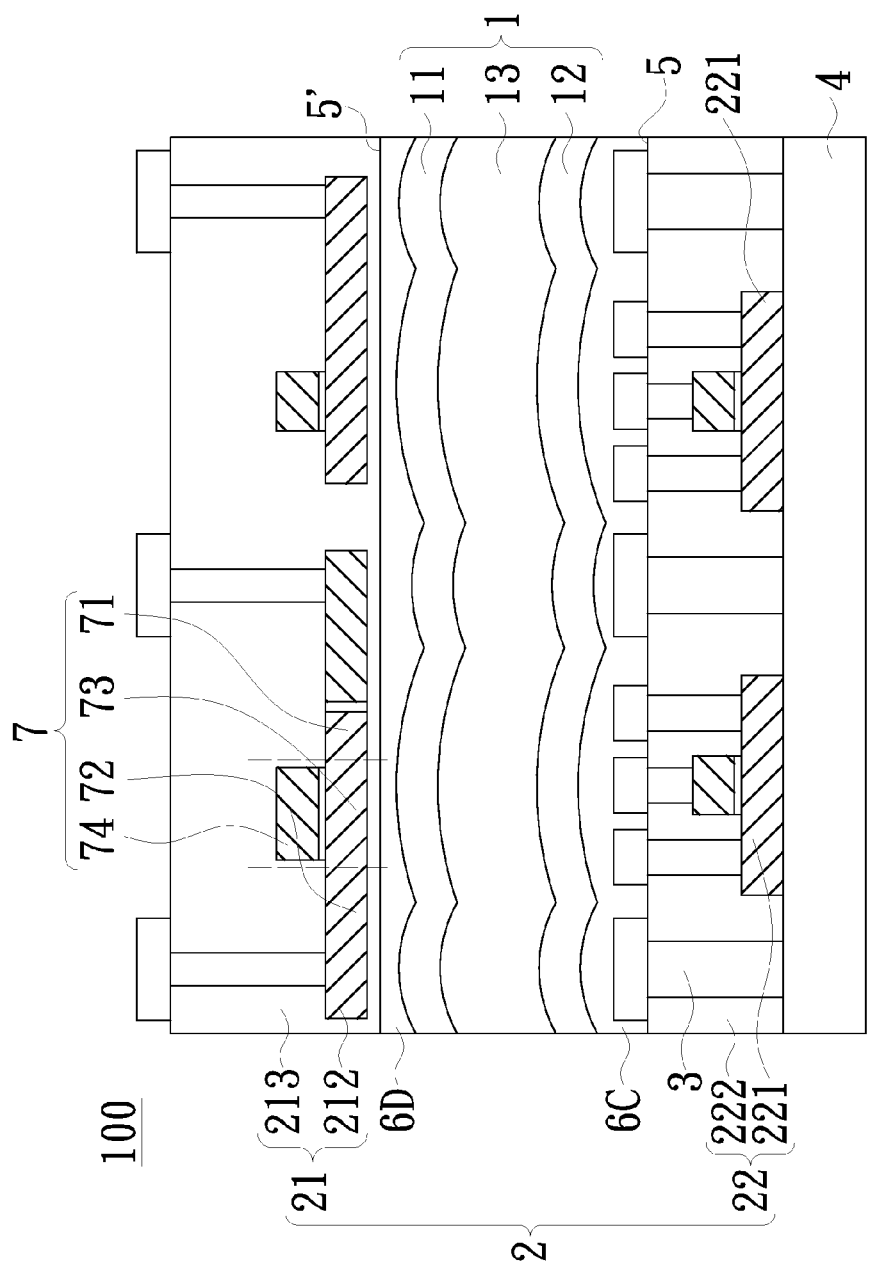

Please refer to FIG. 2, a semiconductor device 100 having a light energy harvesting function includes a light energy harvesting structure 10 and the functional element layer 20 stacked vertically thereto. The vertically stacked structure includes but not limited to two structural layers formed at the same manufacturing process of a wafer, having vertically stacked spatial relationship in the vertical direction due to the different depositing sequence, also includes but not limited to the combination of two individual semiconductor chips or devices which are stacked together. The functional element layer 20 includes the functional element C, and may further includes elements D, E . . . etc., which are electrically connected to the functional element C. Light energy harvesting structure 10 includes a signal transmission point 14, while the functional element C includes a signal receiving point 202 corresponding to the signal transmission point 14, both are electrically connected to each other by an interconnects (not shown). Light energy harvesting structure 10 collects ambient light energy and converts into electricity, and transmits the power signal from the signal transmission point 14 to the signal receiving point 202 for supplying power to operate the functional element(s) C (D, E . . . ). Since the light energy harvesting structure 10 and the functional element layer 20 are vertically stacked, which can significantly reduce the distance H between the energy signal receiving point 202 and the signal transmission point 14 to even less than 10 μm. The functional element C of the functional element layer 20 shown in FIG. 2 and the signal receiving point 202 may be in the same structural layer. On the other hand, as shown in FIG. 3D, FIG. 4D, FIG. 5D, the signal transmission point may be the source 72 of the transistor 7 located within the energy receiving layer 21, and the functional element having a need to use the power and/or other logic/transistor are disposed within the element layer 22 different from the energy receiving layer 21.

The above-mentioned structures can be performed with three-dimensional heterogeneous integration of ambient light energy harvester structures. The ambient light energy harvesting device constructed in low temperature is vertically stacked within any location of low thermal budget devices such as the logic circuit, volatile static memory (SRAMs), non-volatile memory and other functional elements (such as photo detectors, sensing elements and optical waveguide elements, etc.). The ambient energy harvesting device provides the self-powered function to drive the functional chips with the shortest signal and energy transmission distance and lowest power loss. Various embodiments of the structure of the semiconductor device 100 manufactured according the above-mentioned concepts will be described as follows with referring to FIGS. 3A to 5D. First of all, please refer to FIGS. 3D, 4D and 5D, which show various configuration changes between the light energy harvesting structure and the functional elements powered by the former. The semiconductor device 100 with light energy harvesting function includes the substrate 4, the functional element layer 2 and the light energy harvesting layer 1 vertically stacked on the substrate 4, and the interconnects connecting the functional element layer 2 and the light energy harvesting layer 1. The functional element layer 2 includes the energy receiving layer 21 and the element layer 22. The light energy harvesting layer 1 may be formed over the element layer 22 (FIG. 3D), on the surface of the substrate 4 (FIG. 4D), or between the energy receiving layer 21 and the element layer 22 (FIG. 5D).

The substrate 4 may be a silicon substrate, a silica substrate, a glass substrate, a flexible substrate, or any substrate made of material which can withstand the process temperature below 400° C.

Figure 3A:
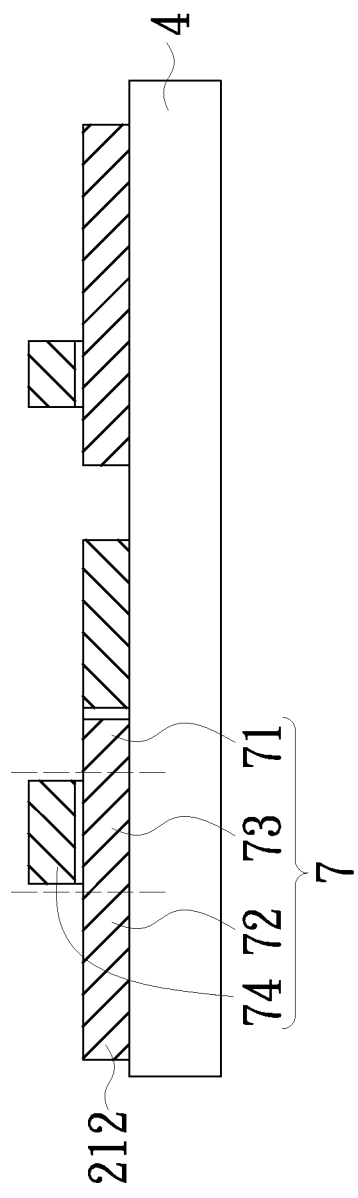
FIGS. 3A to 3D are cross-sectional views schematically illustrating the device manufacturing process according to an embodiment of the present invention.
Figure 3B:
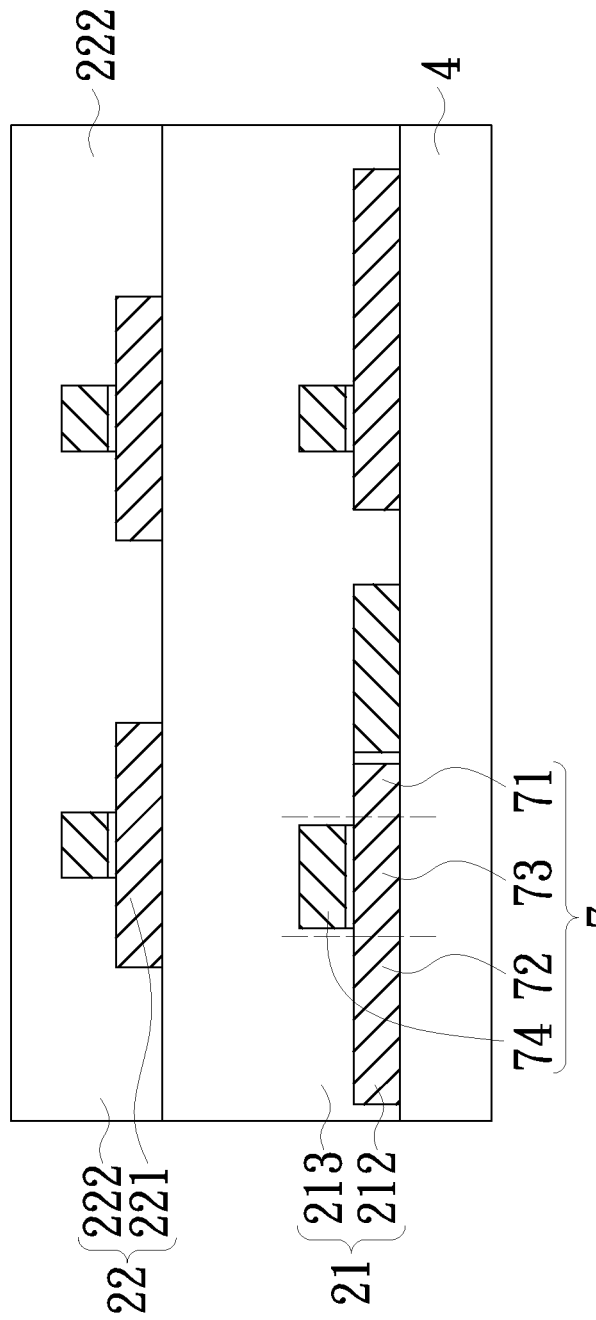
Figure 3C:
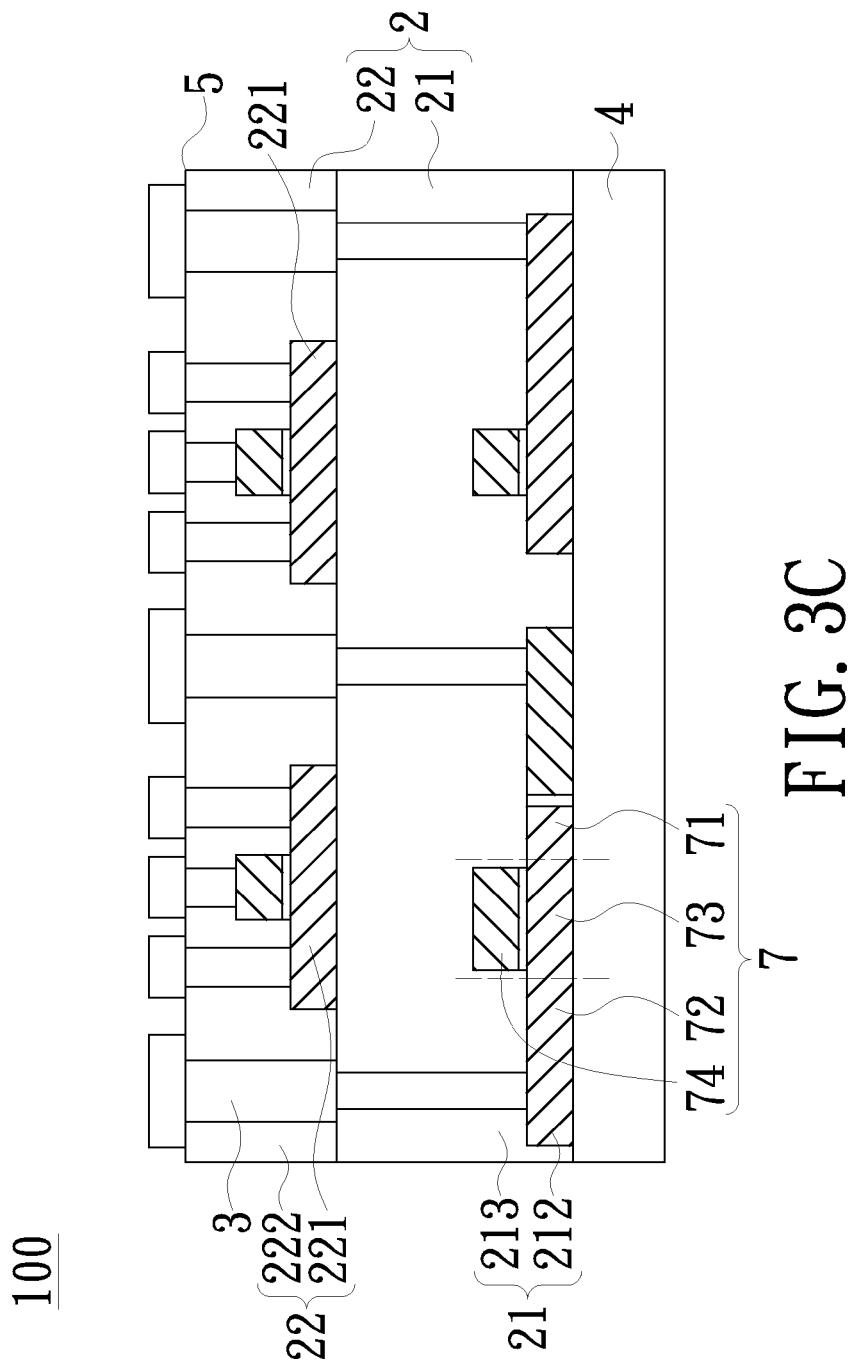
Figure 3D:
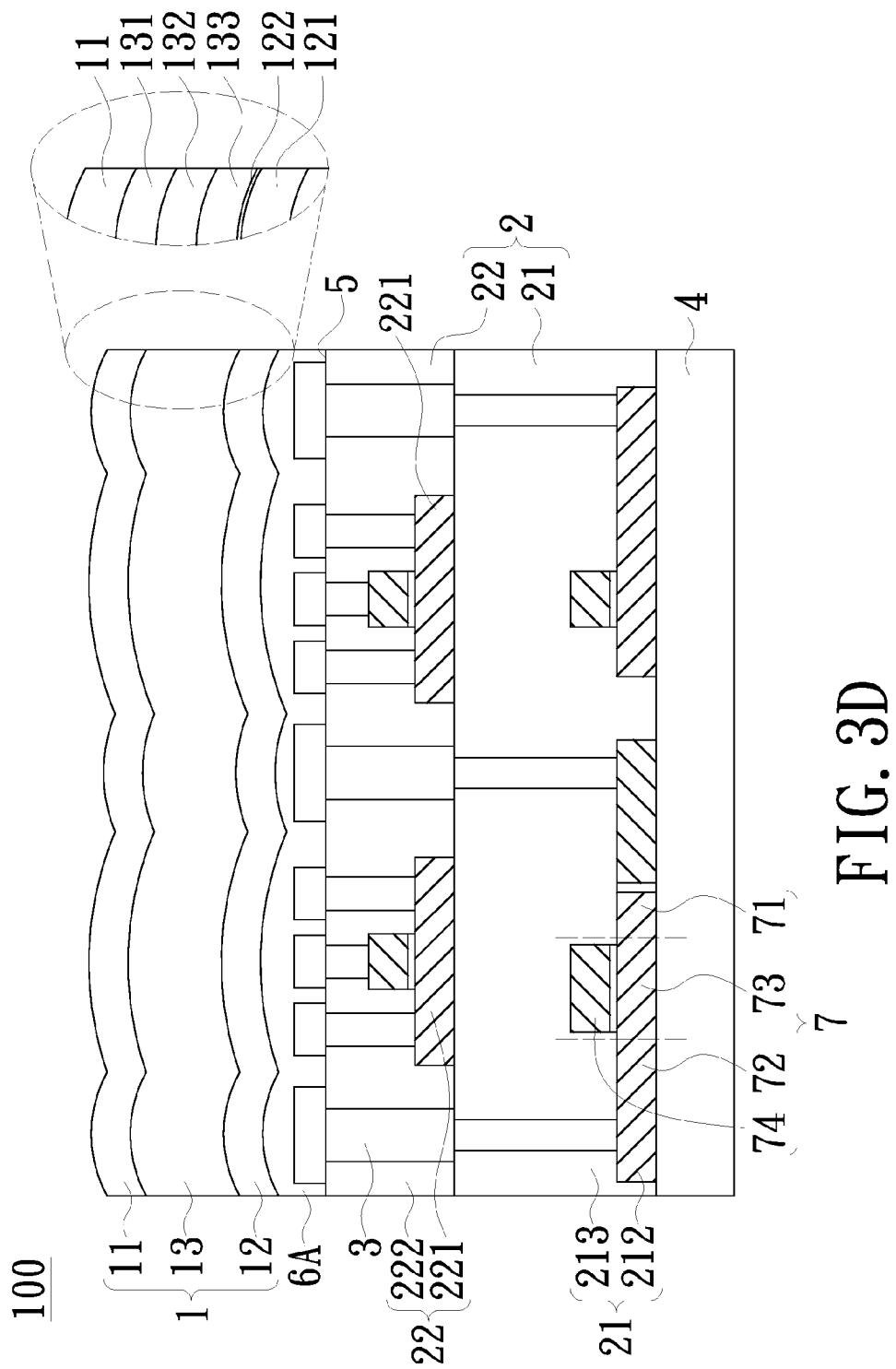

Referring to the partially enlarged view of the light energy harvesting layer 1 illustrated in FIG. 3D, the energy light harvesting layer 1 includes a first conductive layer, a second conductive layer 12, and a light energy absorbing and converting layer 13 sandwiched between the two conductive layers. The light energy absorbing and converting layer 13 is formed by a plurality of amorphous silicon thin films stacked to each other, including at least two opposite polarity extrinsic films, as the P-type semiconductor layer 131 and the N-type semiconductor layer 133 shown in FIG. 3D. There may be an additional intrinsic layer 132 sandwiched between the two extrinsic films 131 and 133. These films may be a solar cell with single, double or multi junctions, and wherein the thin-film multi-junction solar cells can be used to increase the output voltage. The light energy harvesting layer 1 may be at least one, but not limited to the following thin film solar cells: (i) silicon/germanium thin films: amorphous silicon, amorphous germanium, amorphous silicon germanium, microcrystalline silicon, microcrystalline germanium, or microcrystalline silicon germanium thin film solar cells; (ii) organic thin film solar cells; (iii) CIGS thin film solar cells. The above-mentioned three types of solar cells need to have less than 400° C. in heat resistance and are made by process with temperature less than 400° C.

As shown in FIGS. 3D, 4D, and 5D, at least one of the first/second conductive layer 11/12 and the functional element layer 2 are adjacent to each other on at least one adjacent interface 5. The semiconductor device 100 may further include at least one barrier layer (FIG. 3D, 6A; FIG. 4D, 6B; FIG. 5D, 6C). The transparent conductive layer may be regular or irregular shape, formed on the adjacent interface 5. Barrier layer is made of dielectric material.

One of the first conductive layer 11 and the second conductive layer 12 closer to the interface 5 of the adjacent layers may be opaque, and the other one is a transparent conductive layer. The opaque layer may be a photoresist barrier or a light-reflecting layer. In the embodiment shown in FIG. 3D, the second conductive layer 12 near the interface 5 is composed by a transparent conductive layer 121 and an opaque layer 122, so that the second conductive layer 12 might have a light barrier or reflection function. Of course, a variety of changes and adjustments about whether the above-mentioned conductive layer is opaque and its functional choice depend on the needs of practical applications.

The energy receiving layer 21 includes an insulating layer 213 and a polysilicon film 212 formed within the insulating layer 213. The polysilicon thin film transistor structure 212 has a drain structure 77 of a transistor 7, a source structure 72 and a channel structure 73. The transistor structure 7 further includes a gate structure 74, which belongs to the gate structure formed on the polysilicon film 212 by a succeeding process. The interconnects 3 is connected between the source structure 72 and the transparent conductive layer of the energy light harvesting layer 1 adjacent to the polysilicon film 212, and the length of the interconnects 3 is less than 10 μm. Multi-monocrystalline silicon/polycrystalline silicon-based crystalline solar cells are the main stream of traditional ambient light energy harvesting devices. Although such types of solar cells can provide high photoelectric conversion efficiency (16-20%), but require the use of 220~250 μm thick silicon substrate as the absorption layer, which is inapplicable for three-dimensional heterogeneous vertical integrations. Meanwhile, the capacity of silicon solar cells in indoor light is also lower than that of the amorphous silicon solar cell.

According to the concept of the present invention, the ambient light energy (indoor light and outdoor light) harvesting device is embedded into the monolithic heterogeneous 3DIC chip for manufacturing self-powered monolithic heterogeneous 3DIC chips. Amorphous silicon-germanium-carbon film solar cells are utilized as the ambient light collection device, embedded in low thermal budget functional elements for absorbing ambient light and converting to electrical energy, so as to provide the voltage required for driving the functional elements.

As shown in FIG. 3A, the thicker amorphous semiconductor film (reference numeral 212 in FIG. 3A) is deposited on the first insulating layer (i.e. the substrate 4 in this embodiment) in plasma. Then the crystallization process (Green laser anneal, GLA) is executed to induce the micron (μm) level of semiconductor crystal grains and thus form the poly semiconductor film (polysilicon, germanium or silicon germanium film) 212 (poly-Si). Moreover, the chemical mechanical grinding in nano/micrometer level is performed to improve surface roughness of polysilicon, polysilicon germanium and polycrystalline germanium films and reduce the channel thickness, and multi-stage interface modification technology is introduced to reduce the crystal surface defect density of polysilicon, polysilicon germanium or germanium. Then, perform an etching process to define a channel structure 73 and form the drain structure 71 and the source structure 72. The follow-up steps include forming the gate structure 74 (high-k/metal gate, HK/MG) and defining source/drain region of the transistor structure 7, and performing the activation engineering ($CO_2$ laser anneal, $CO_2$-LA). Metal silicide technology may be introduced to further reduce the element series impedance. Finally, silicon dioxide is deposited to serve as the insulating layer 213, and the energy receiving layer 21 as shown in FIG. 3B is completed. After then, the element layer 22 is formed above the energy receiving layer 21 with manufacturing temperature which cannot affect the quality of the energy receiving layer 21.

Wherein, in the production of the gate structure 74, the source/drain region (ie, the drain structure 71 and the source structure 72) may be activated in a temperature above 500° C. at the time interval from nanoseconds to several seconds (the length of the time interval is ranged between, for example, about 1 nanosecond to 1 second). In another embodiment, the activation of the source/drain region may be induced by light, electricity or heat, etc., in nanoseconds to several seconds time interval (i.e., time interval length between, for example, about 1 nanosecond to 1 second), which may avoid damage of the metal gate such as titanium nitride, tantalum or aluminum (TiN, TaN, Al), etc., and the source/drain regions implanted with boron (B), phosphorus (P) will have a sheet resistance of arsenic (As) less than 300 ohm/sq. Followed by the completion of the transistor metal wiring works shown in FIG. 3C to form interconnects 3. Finally, it is shown in FIG. 3D, the barrier layer 6A is formed above the monolithic heterogeneous 3DIC chip (i.e., the substrate 4 and the functional element layer 4 formed thereon), and then deposit a transparent conductive oxide (TCO) to form the first conductive layer 11, and then sequentially deposit in-situ p-doped amorphous silicon-germanium-carbon film (P-type semiconductor layer 131), the intrinsic layer (i-layer) silicon-germanium-carbon film (intrinsic layer 132) and the in-situ n-doped amorphous silicon-germanium-carbon film (N-type semiconductor layer 133), and finally deposit above all the TCO film (second conductive layer 12). This ambient light energy harvesting device can be a single received optical energy collecting apparatus surface, double junction and multi-junction thin-film solar cells, providing appropriate current/voltage to the lower element.

The experiment showed that compared to the single-crystal silicon (c-Si) and microcrystalline silicon (μc-Si) solar cells, amorphous silicon-germanium-carbon thin film solar cell is far superior in indoor light energy harvesting capacity. Furthermore, when a stacked type multi-junction amorphous silicon-germanium-carbon thin film solar cell serves as the solar energy collection device 1, high efficiency output will be obtained, and the amorphous silicon-germanium-carbon external quantum effects and response in the short wavelength are also enhanced, so it's quite suitable for harvesting the energy of fluorescence light, LED lamps and other interior lighting of the acquisition. Indoor light herein means the light intensity is less than 1000 lux ($lm/m^2$) of the light source. In accordance with the present invention, amorphous silicon germanium thin film solar cells have a drive capability, under indoor lighting (100 $\mu W/cm^2$), for driving 150,000 inverters and 100,000 SRAMs.

The embodiment illustrated in FIGS. 4A~4D is different from the one shown in FIGS. 3A~3D in that a light energy harvesting structure 1 is manufactured firstly on the glass substrate 4. The light energy harvesting structure 1 may be thin-film solar cells with single light collecting junction, double junction or multi junction, and is designed to provide suitable current/voltage to the lower element. And then, on the single junction, double junction or multi-junction thin-film solar cells, various types of logic and functional elements are manufactured in low thermal budget. Finally, the ambient light energy harvesting device are connected with the elements in every layer through optimized metal interconnect process.

Another arrangement of the films/layers is illustrated in FIGS. 5A-5D. A first functional element layer (such as the element layer 22) is manufactured firstly, and then the light energy harvesting structure 1 is manufactured above the first functional element layer 22, and finally another functional element layer (e.g. the energy receiving layer 21) are formed over the light energy harvesting structure 1.

Since the logic elements, the functional elements and the light energy harvester of the present invention are produced via technology and equipment used (amorphous silicon, amorphous silicon germanium or amorphous germanium thin film deposition by plasma, green pulse laser crystallization, chemical mechanical polishing and interface modification technology, atomic layer deposition high-k materials, long-wavelength laser activation technology, TCO sputtering deposition and plasma thin film deposition of amorphous silicon germanium carbon), are all existing semiconductor and thin film transistor manufacturing processes, and can also be fully compatible with the production of related products; on the other hand, the low-temperature technique of the present invention, together with flat and thin polysilicon, polysilicon germanium film and polycrystalline germanium channel layer, and the light energy harvester, and will be demonstrated considerable technical advantage in the novel monolithic heterogeneous 3DIC chip integration.

The concept of vertically stacking the light trapping layer and the functional element layer according to the present invention may also be applied in conjunction with through silicon via (TSV) stack technology. Referring again to FIG. 2, when the light energy harvesting structure 10 and the functional element layer 20 belong to different chips, both can be combined via TSV technology, then the distance H' between the energy signal receiving point 202 and the signal transmission point 14 will be less than 1 mm, about 300 μm, or ranged between 200~400 μm, still shorter than the energy transmission distance in combination of both in a conventional two-dimensional circuit board. Of course, in the aforementioned low thermal budget monolithic heterogeneous 3DIC chip, the light energy harvesting structure 10 and the functional element layer 20 are integrated in the same chip, the distance H' will be reduced even shorter. Refer to FIG. 3D, when the energy receiving layer 21 and the element layer 22 are in the interval between the light energy harvesting structure 1 and the source structure 72 which receives the energy (i.e., the functional element is disposed between the energy signal transmission point and the energy signal receiving point), the distance H' may be less than 100 µm. And if as shown in FIGS. 4D and 5D, the light energy harvesting structure 1 and the source structure 72 adjacent to each other, the distance H' can be even less than 10 µm. Wherein, there may be a plurality of energy signal receiving points and energy signal transmission points to strengthen the collection ability of indoor light.

In summary, the present invention utilizes amorphous silicon-germanium-carbon film solar cell with manufacturing process compatible to the semiconductor manufacturing process, and may use a single junction, double junction or multi-junction approach to achieve high current and high voltage output requirements. Meanwhile, the amorphous silicon carbon-germanium-carbon thin film solar cells have excellent response to both indoor and outdoor light, and thus are advantaged for harvesting energy of multi-directional light (such as energy harvesting of fluorescent and LED lights, or other indoor lighting). On the other hand, the amorphous silicon germanium-carbon energy harvesting device is integrated with the low thermal budget monolithic heterogeneous 3DIC chip. With the use of sophisticated lithography techniques, precise device-to-device alignment is carried out between the layers, which can effectively solve the problems such as the integration between the light energy harvesting device and the monolithic heterogeneous 3DIC chip, the long signal transmission, the long-distance energy transmission, and the high power loss and other issues. Furthermore, the present invention allows the light energy harvesting device to be embedded at any location in monolithic heterogeneous 3DIC chips, and thus has a high design flexibility.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

The invention claimed is:

1. A semiconductor device, comprising:
  a light energy harvesting structure having a first conductive layer and a second conductive layer, and a light energy absorbing and converting layer sandwiched in the first conductive layer and the second conductive layer, wherein the light energy absorbing and converting layer includes at least two extrinsic layers, one of the extrinsic layers is a P-type semiconductor layer, the other one of the extrinsic layer is an N-type semiconductor layer, and at least one of the first conductive layer and the second conductive layer includes an energy signal transmission point, wherein the light energy harvesting device is a stacked type multi-junction thin film solar cell; and
  at least one functional element layer vertically stacked with the light energy harvesting structure, wherein the functional element layer includes at least one functional element, and an energy signal receiving point corresponding to the energy signal transmission point and electrically connected to the functional element, wherein the energy signal transmission point and the energy signal receiving point are connected by an interconnects, and the distance between the energy signal transmission point and the energy signal receiving point is less than 1 mm, and the functional element layer includes an energy receiving layer which includes a source structure, and the energy signal receiving point located at the source structure; and an element layer including at least one of the functional element, wherein the functional element is selected from at least one of an IoT chip, a photo detector, a sensing element and an optical waveguide element, wherein the element layer is sandwiched between the light energy harvesting layer and the energy receiving layer, and the distance between the energy signal transmission point and the energy signal receiving point is less than 100 µm.

2. The semiconductor device according to claim 1, wherein the light energy absorbing and converting layer collects an indoor light and converts into electricity, wherein intensity of the indoor light is less than 1000 lux ($lm/m^2$).

3. The semiconductor device according to claim 1, wherein the extrinsic layers are silicon-germanium-carbon films and the light energy harvesting structure is a silicon-germanium-carbon thin film solar cell.

4. A chip with light energy harvesting functions, comprising:
  a substrate;
  at least a functional element layer and a light energy harvesting structure, vertically stacked on the substrate, wherein the light energy harvesting device is a stacked type multi-junction thin film solar cell; and
  an interconnects electrically connecting between the functional element layer and the light energy harvesting structure, wherein the functional element layer includes an energy receiving layer which includes a source structure receiving energy from the light energy harvesting structure; and an element layer including at least one functional element electrically connected to the source structure, wherein the functional element is selected from at least one of an IoT chip, a photo detector, a sensing element and an optical waveguide element, wherein the element layer is sandwiched between the light energy harvesting layer and the energy receiving layer, and the distance between the energy signal transmission point and the energy signal receiving point is less than 100 µm.

5. The chip according to claim 4, wherein the light energy harvesting structure is formed at one of the locations: the surface of the element layer, the surface of the substrate, and the interval between the energy receiving layer and the element layer.

6. The chip according to claim 4, wherein the light energy harvesting structure and the functional element layer are adjacent to each other at an interface, and the chip further includes a barrier layer formed on the interface, wherein the barrier layer is made of dielectric material.

7. The chip according to claim 6, wherein the light energy harvesting layer further includes two conductive layers, and one of the conductive layer closer to the interface is an opaque layer.

8. The chip according to claim 7, wherein the opaque layer is a photoresist barrier.

9. The chip according to claim 7, wherein the opaque layer is a light-reflecting layer.

10. The chip according to claim 7, wherein the interconnects connects between the energy receiving layer and one of the conductive layer, and the length of the interconnects is less than 1 mm.

11. The chip according to claim 4, wherein the substrate is selected from one of a silicon dioxide substrate, a glass substrate, a flexible-type substrate, and a substrate made of a material which can withstand a temperature lower than 400° C.

12. A semiconductor device with self-powered function, comprising
   an energy receiving layer including a source structure;
   an element layer including at least one functional element electrically connected to the source structure, wherein the functional element is selected from at least one of an IoT chip, a photo detector, a sensing element and an optical waveguide element; and
   an ambient light energy harvesting structure electrically connected with the functional element through the source structure to drive the functional element, wherein the ambient light energy harvesting, structure is a stacked type multi-junction thin film solar cell vertically stacked within the energy receiving layer and the element layer, wherein the ambient light energy harvesting structure provides power to the at least one functional element through a energy signal transmission point, while the at least one functional element receives power from the ambient light energy harvesting structure at an energy signal receiving point, wherein the at least one functional element is disposed between the energy signal transmission point and the energy signal receiving point, and the distance between the energy signal transmission point and the energy signal receiving point is less than 100 μm.

13. The semiconductor device according to claim 12, wherein the ambient light energy harvesting structure is a thin film solar cell.

14. The semiconductor device according to claim 13, wherein the heat resistance of the thin film solar cell is less than 400° C.

* * * * *